(12) United States Patent (10) Patent No.: US 8,811,110 B2
Schaefer et al. (45) Date of Patent: Aug. 19, 2014

(54) CONFIGURATION FOR POWER REDUCTION IN DRAM

(75) Inventors: Andre Schaefer, Braunschweig (DE); John B. Halbert, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 21 days.

(21) Appl. No.: 13/536,724

(22) Filed: Jun. 28, 2012

(65) Prior Publication Data

US 2014/0006700 A1    Jan. 2, 2014

(51) Int. Cl.
*G11C 8/00* (2006.01)
*G11C 8/08* (2006.01)
*G11C 11/404* (2006.01)

(52) U.S. Cl.
CPC .............. *G11C 8/08* (2013.01); *G11C 11/4045* (2013.01)
USPC ....... 365/230.06; 365/149; 365/193; 365/227

(58) Field of Classification Search
CPC .............................. G11C 8/08; G11C 11/4045
USPC .............................. 365/149, 193, 227, 230.06
See application file for complete search history.

(56) References Cited

U.S. PATENT DOCUMENTS

| | | | |
|---|---|---|---|
| 5,761,135 A * | 6/1998 | Lee ......................... | 365/189.11 |
| 6,421,295 B1 * | 7/2002 | Mao et al. ................ | 365/230.06 |
| 2001/0010650 A1 * | 8/2001 | Lee ............................... | 365/198 |
| 2001/0043502 A1 | 11/2001 | Ooishi | |
| 2010/0177586 A1 | 7/2010 | Sung et al. | |
| 2011/0019495 A1 | 1/2011 | Scheuerlein et al. | |
| 2012/0134226 A1 | 5/2012 | Chow | |

FOREIGN PATENT DOCUMENTS

EP    2458505 A1    5/2012

OTHER PUBLICATIONS

International Search Report and Written Opinion in related PCT matter, PCT/US2013/45739, mailed Apr. 4, 2014.

* cited by examiner

*Primary Examiner* — Hoai V Ho
(74) *Attorney, Agent, or Firm* — Schwabe, Williamson & Wyatt, P.C.

(57) ABSTRACT

Disclosed embodiments may include an apparatus having a segment wordline enable coupled to logic to selectively disable ones of a number of segment wordline drivers. The logic may partition a page of the apparatus to reduce power consumed through activation of the disabled ones of the number of segment wordlines. Other embodiments may be disclosed.

9 Claims, 5 Drawing Sheets

CONFIGURATION FOR POWER REDUCTION IN DRAM

TECHNICAL FIELD

Embodiments of the present disclosure relate generally to a configuration for reducing power consumption in dynamic random access memory (DRAM).

BACKGROUND INFORMATION

Dynamic random access memory (DRAM) stacking may be useful for increasing the amount of memory available in a computing system. Although memory may be increased by positioning multiple dies on a single plane, DRAM stacking may offer the particular advantage of increasing memory without a proportionate increase in the size of the footprint on the printed circuit board to which the dies are electrically coupled. Increased memory sizes may be accompanied by linear increases power consumed by the memory.

BRIEF DESCRIPTION OF THE DRAWINGS

Embodiments of the invention are illustrated by way of example, and not by way of limitation, in the figures of the accompanying drawings in which like reference numerals refer to similar elements.

DESCRIPTION OF THE EMBODIMENTS

Embodiments of the present disclosure may relate to configuring dynamic random access memory (DRAM) or DRAM stacks to reduce power consumption. In embodiments, a DRAM page size may be divided logically over a stack of DRAM dies to reduce overall row activation power consumption. In embodiments, a DRAM page is selectively divided in a DRAM die by partitioning a master wordline into a lower sub-wordline and an upper sub-wordline.

Various aspects of the illustrative embodiments will be described using terms commonly employed by those skilled in the art to convey the substance of their work to others skilled in the art. It will be apparent to those skilled in the art, however, that some alternate embodiments may be practiced using portions of the described aspects. For purposes of explanation, specific numbers, materials, and configurations are set forth in order to provide a thorough understanding of the illustrative embodiments. It will be apparent to one skilled in the art, however, that alternate embodiments may be practiced without the specific details. In other instances, well-known features are omitted or simplified in order to not obscure the illustrative embodiments.

Further, various operations will be described as multiple discrete operations, in turn, in a manner that is most helpful in understanding the illustrative embodiments; however, the order of description should not be construed as to imply that these operations are necessarily order dependent. In particular, these operations need not be performed in the order of presentation.

The phrase "in one embodiment" is used repeatedly. The phrase generally does not refer to the same embodiment; however, it may. The terms "comprising," "having," and "including" are synonymous, unless the context dictates otherwise. The phrase "A/B" means "A or B". The phrase "A and/or B" means "(A), (B), or (A and B)". The phrase "at least one of A, B and C" means "(A), (B), (C), (A and B), (A and C), (B and C) or (A, B and C)". The phrase "(A) B" means "(B) or (A B)", that is, A is optional.

Figure 1A:
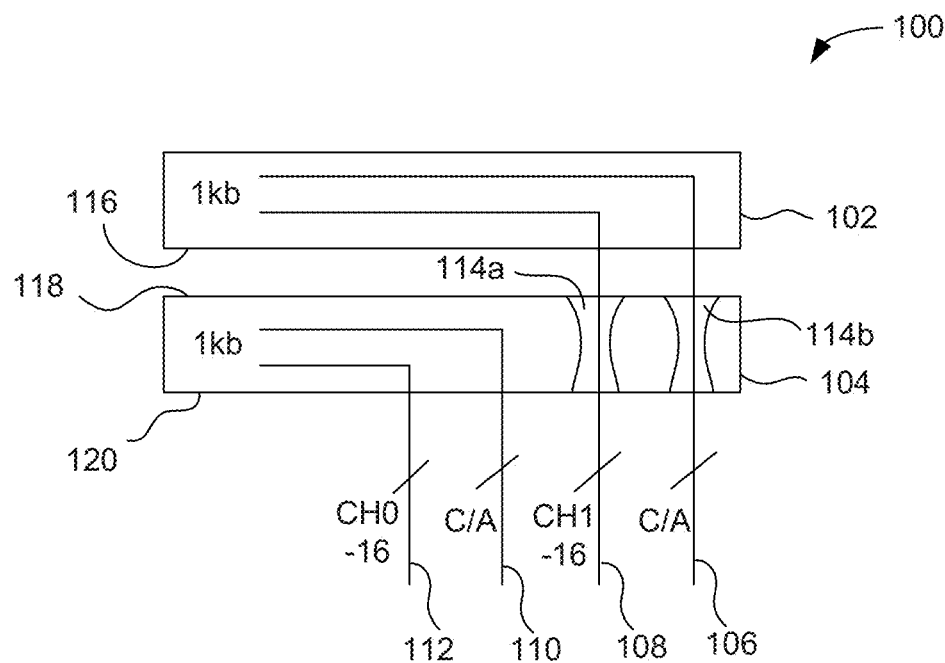
FIGS. 1A-1B illustrate block diagrams of DRAM stacks, according to various embodiments of the present disclosure.

FIG. 1 illustrates a side-view of DRAM stack 100 configured to operate with reduced power consumption as compared to traditional DRAM stacks, according to various embodiments of the disclosure. DRAM stack 100 includes a DRAM die 102 stacked on top of a DRAM die 104.

DRAM die 102 may be a memory die that is configured to reduce overall power consumption of DRAM die 102 by selectively partitioning one or more master wordlines. DRAM die 102 may include a command address (C/A) bus 106 and a data bus 108. The command address bus 106 may be coupled to one or more arrays of storage cells and may be configured to selectively enable access to the storage cells of the one or more arrays. The command address bus 106 may be coupled to the one or more master wordlines to cause the master wordlines to drive segment wordlines and local wordlines of the one or more arrays of DRAM 102. Data bus 108 may be communicatively coupled to the storage cells of the one or more arrays and may be configured to transfer data to and from the storage cells.

Similar to DRAM die 102, DRAM die 104 may be a memory die that is configured to reduce overall power consumption of DRAM die 104 by selectively partitioning one or more master wordlines. DRAM die 104 may include a command address bus 110 and a data bus 112. The command address bus 110 and the data bus 112 of DRAM die 104 may be configured in a manner as described above for DRAM die 102.

Each of DRAM dies 102 and 104 may be configured to selectively drive half of the respective page sizes of DRAM dies 102 and 104 to reduce wordline driving power by approximately half by splitting or partitioning one or more master wordlines in each die. A single DRAM die, e.g., having a 2 kiloByte (kB) page size, may be replaced with DRAM dies 102 and 104, e.g., each having a 1 kB page size and which may be stacked to provide a footprint on a printed circuit board (PCB) that is similar to the single die.

In embodiments, DRAM stack 100 may be configured to enable point to point access to each of DRAM dies 102 and 104. DRAM die 104 may include a number of through-silicon-vias (TSVs) 114a, 114b (collectively 114) configured to couple all terminals from a lower surface 116 of DRAM die 102 and from an upper surface 118 of DRAM die 104 to a lower surface 120 of DRAM die 104. This point to point configuration may enable a memory controller to independently access DRAM die 102 and independently access DRAM die 104. According to various embodiments, command address buses 106 and 110 are independent from each other.

Figure 1B:
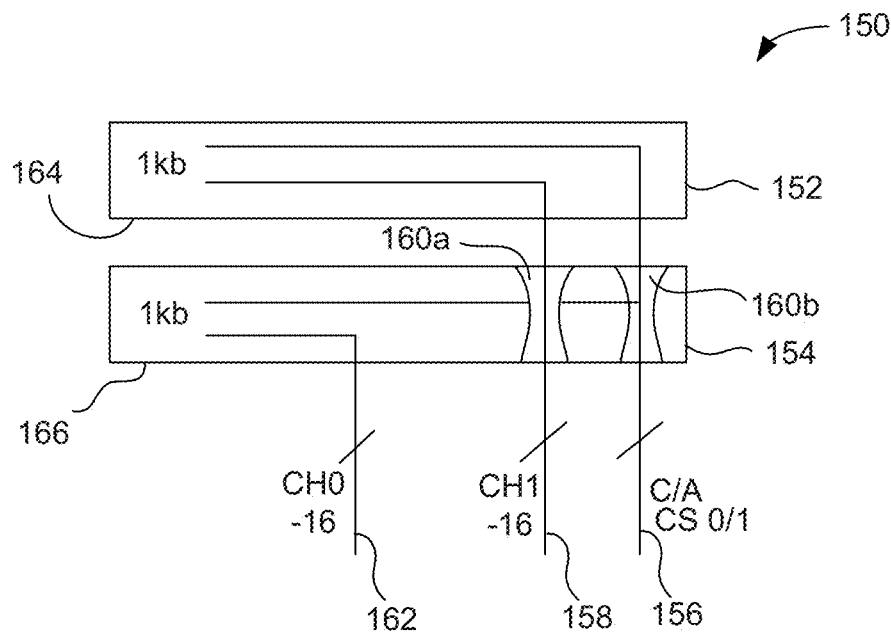

FIG. 1B illustrates a DRAM stack 150 configured to operate with reduced power consumption and having a common command address bus. DRAM stack 150 includes a DRAM die 152 stacked on a DRAM die 154. DRAM die 152 may include a common command address bus 156 that may be shared between DRAM dies 152 and 154. Command address bus 156 may include a line dedicated to chip select, e.g., CS 0/1, which may be configured to enable a memory controller to select between DRAM die 152 and DRAM die 154. DRAM die 152 may also include a data bus 158. DRAM die 154 may include TSVs 160a, 160b (collectively 160) and a data bus 162. TSVs 160 may provide a conductive path from a lower surface 164 of DRAM die 152 to a lower surface 166 of DRAM die 154 for all terminals of DRAM die 154.

According to various embodiments, DRAM stacks 100 and 150 may each include 3, 4, or more stacks of DRAM dies. If 3 or more DRAM dies are incorporated into a stack, each page of each of the 3 or more DRAM dies may be physically and/or logically partitioned according to embodiments of the disclosure in order to reduce power consumption of the 3 or more DRAM dies.

Figure 2:
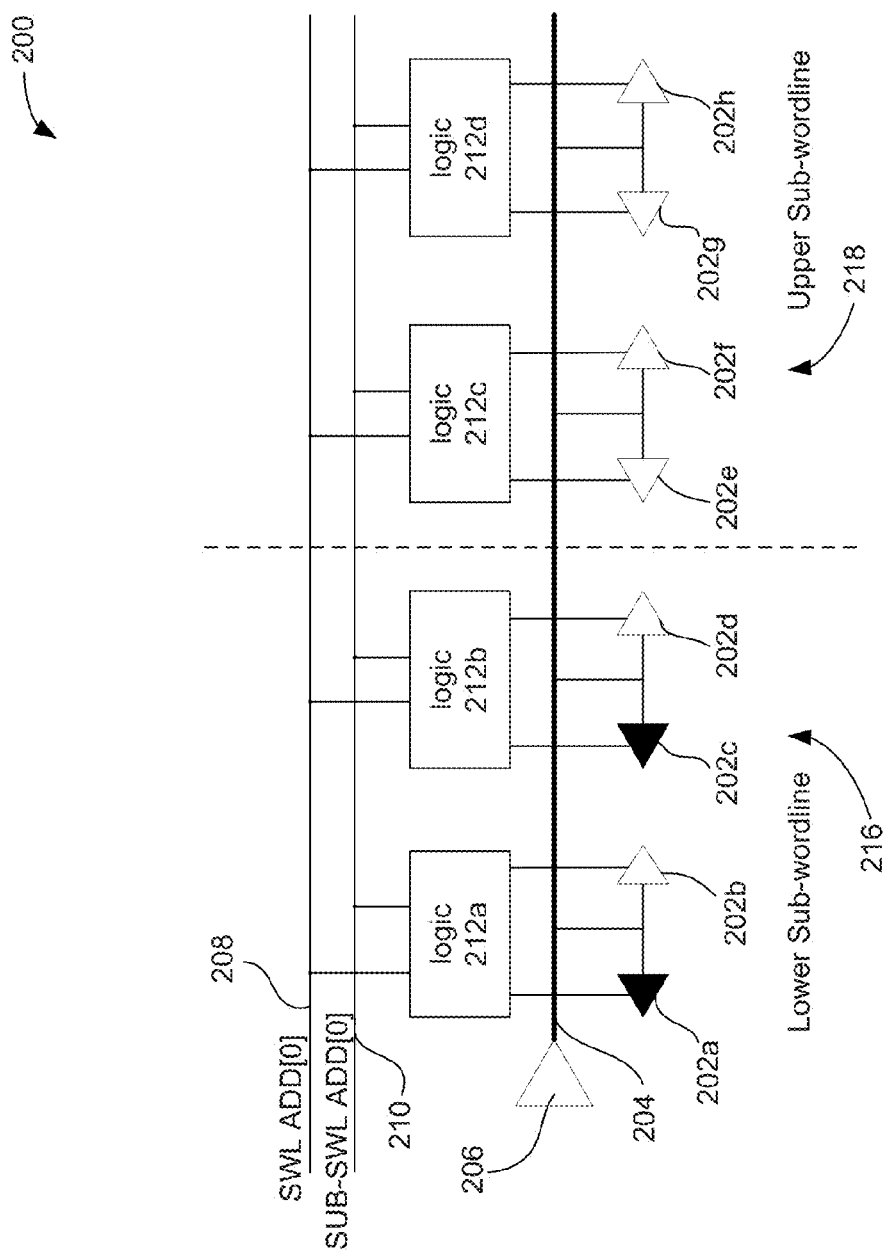
FIG. 2 illustrates an electrical diagram of a wordline segment addressing configuration for the memory stacks of FIGS. 1A-1B, according to various embodiments of the present disclosure.

FIG. 2 illustrates a wordline configuration 200 which may enable partitioning a master wordline to reduce power consumed by DRAM dies 102, 104, 152, 154 and/or DRAM stacks 100 and 150. Wordline configuration 200 may include segment wordline drivers 202a-h (collectively 202), a master wordline 204, and a master wordline driver 206. Wordline configuration 200 may also include segment wordline (SWL) address line 208, sub-segment wordline address line 210, and logic 212a, 212b, 212c, and 212d (collectively 212).

Segment wordline drivers 202 may each be coupled to an individual segment wordline and be configured to activate a row of memory cells in response to signals received on master wordline 204. Master wordline 204 may be coupled to drive each of segment wordline drivers 202. Master wordline 204 may be selectively driven high and selectively driven low by master wordline driver 206. According to various embodiments, master wordline driver 206 may be responsive to one or more signals received by DRAM dies 102, 104, 152, and/or 154. For example, master wordline driver 206 may be responsive to row addresses and row address strobe (RAS) signals received at one or more of command address buses 106, 110, and/or 156.

Segment wordline address line 208 may be configured to enable logic 212a-212d (collectively 212) to select between each of the two or more segments wordline drivers 202 which are coupled to a logic 212. For example, if segment wordline address line 208 is driven logic level high, logic 212 may be configured to enable segment wordline drivers 202a, 202c, 202e, and 202g to activate their respective segment wordlines. If segment wordline address line 208 is driven logic level low, logic 212 may be configured to disable segment wordline drivers 202a, 202c, 202e, and 202g and be configured to enable wordline drivers 202b, 202d, 202f, and 202h to activate their respective segment wordlines.

Sub-segment wordline address line 210 may be configured to enable one of logic 212 while disabling the other of logic 212. For example, if sub-segment wordline address line is driven logic level high, logic 212 may be configured to enable segment wordline drivers 202a-202d. Additionally, if segment wordline address line 208 is concurrently driven logic level high, then logic 212a and logic 212b may enable segment wordlines 202a and 202c (represented as black for enabled), respectively, to be responsive to signals on master wordline 204. In this same example, while sub-segment wordline address line 210 is high, logic 212c and logic 212d may be disabled so that none of segment wordline drivers 202e-h are responsive to master wordline 204. Thus, by including sub-segment wordline address line 210, wordline configuration 200 may effectively partition master wordline 204 and segment wordline drivers 202a-h into a lower sub-wordline 216 and into an upper sub-wordline 218.

According to embodiments, segment wordline address line 208 may be a first segment wordline enable. Sub-segment wordline address line 210 may be a second segment wordline enable.

Many memory cells that are coupled to a wordline may be activated and then not be read from or written to. Such wordline activation may contribute to inefficient power consumption. Wordline activation may contribute to a substantially greater amount of power consumption by a memory die than column, e.g. bitline, activation. Wordline activation may mean master and or segment wordline activation and bitline activation, i.e., bit sensing, across an entire page. Column access may be just allowing a few bits to pass through to the DRAM array input/output (I/O) circuitry, which may be inherently less power consuming. According to various embodiments, reducing power consumed by wordlines may approximately reduce overall power consumed by a memory die. For example, if wordline power consumption is reduced by half, overall power consumed by a memory die may also be approximately reduced by half. According to various embodiments, sub-segment wordline addressed line 210 may occupy one or more lines of command address buses 106, 110, and/or 156.

Figure 3:
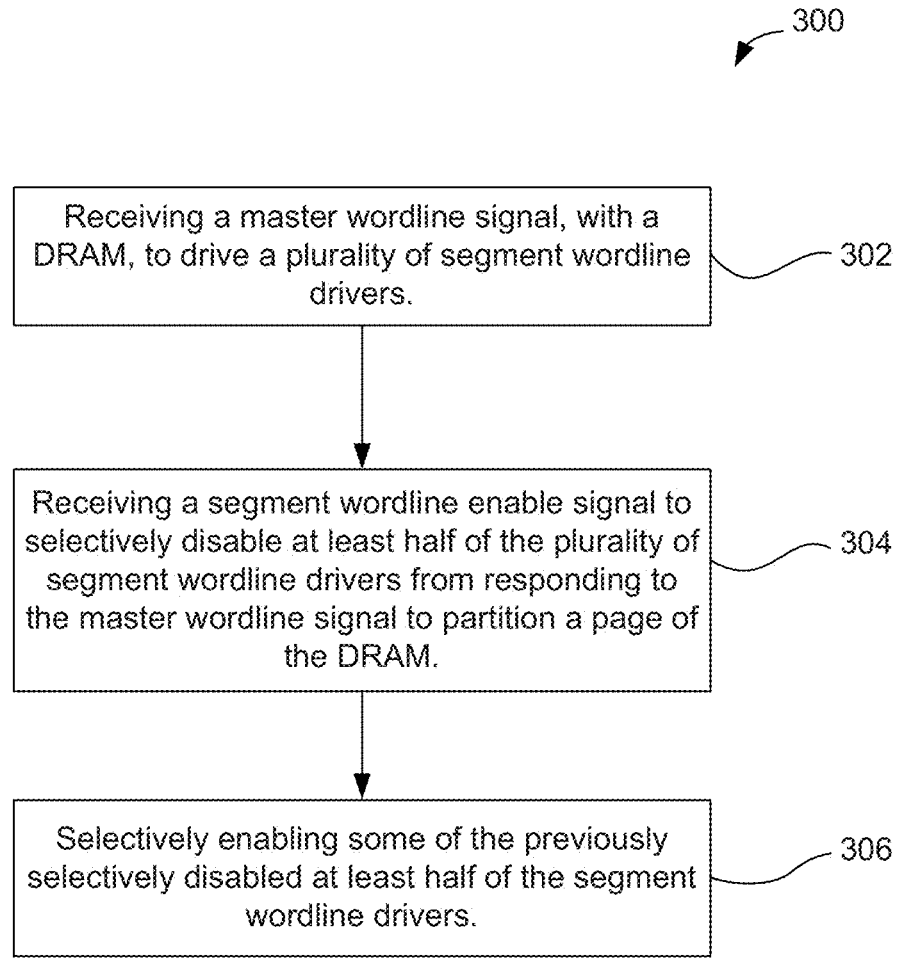
FIG. 3 describes a flow chart of an operation of the wordline segment addressing configuration of FIG. 2, according to various embodiments of the present disclosure.

FIG. 3 illustrates a flow chart 300 of an operation of wordline configuration 200, according to various embodiments of the disclosure.

At block 302, a DRAM die may receive a master wordline signal to drive a plurality of segment wordline drivers. According to embodiments, the DRAM die may have a number of master wordline and each wordline may be configured to drive a number of segment wordline drivers associated with sub arrays within the memory array of the DRAM die.

At block 304, a DRAM die may receive a first segment wordline address signal, e.g., on segment wordline address line, to selectively enable segment wordline drivers to respond to a master wordline signal. According to one embodiment, the first segment wordline address signal may be configured to enable or disable approximately half of the segment wordline drivers associated with sub arrays of memory within the DRAM die.

At block 306, a DRAM die may receive a second segment wordline address signal configured to disable approximately half of the plurality of segment wordline drivers. As described above, disabling approximately half of the plurality of segment wordline drivers may correspond to a decrease in the overall power consumption of the DRAM die by approximately half. According to one embodiment, the second segment wordline address signal may be received on sub-segment wordline address line 210 of FIG. 2.

Figure 4:
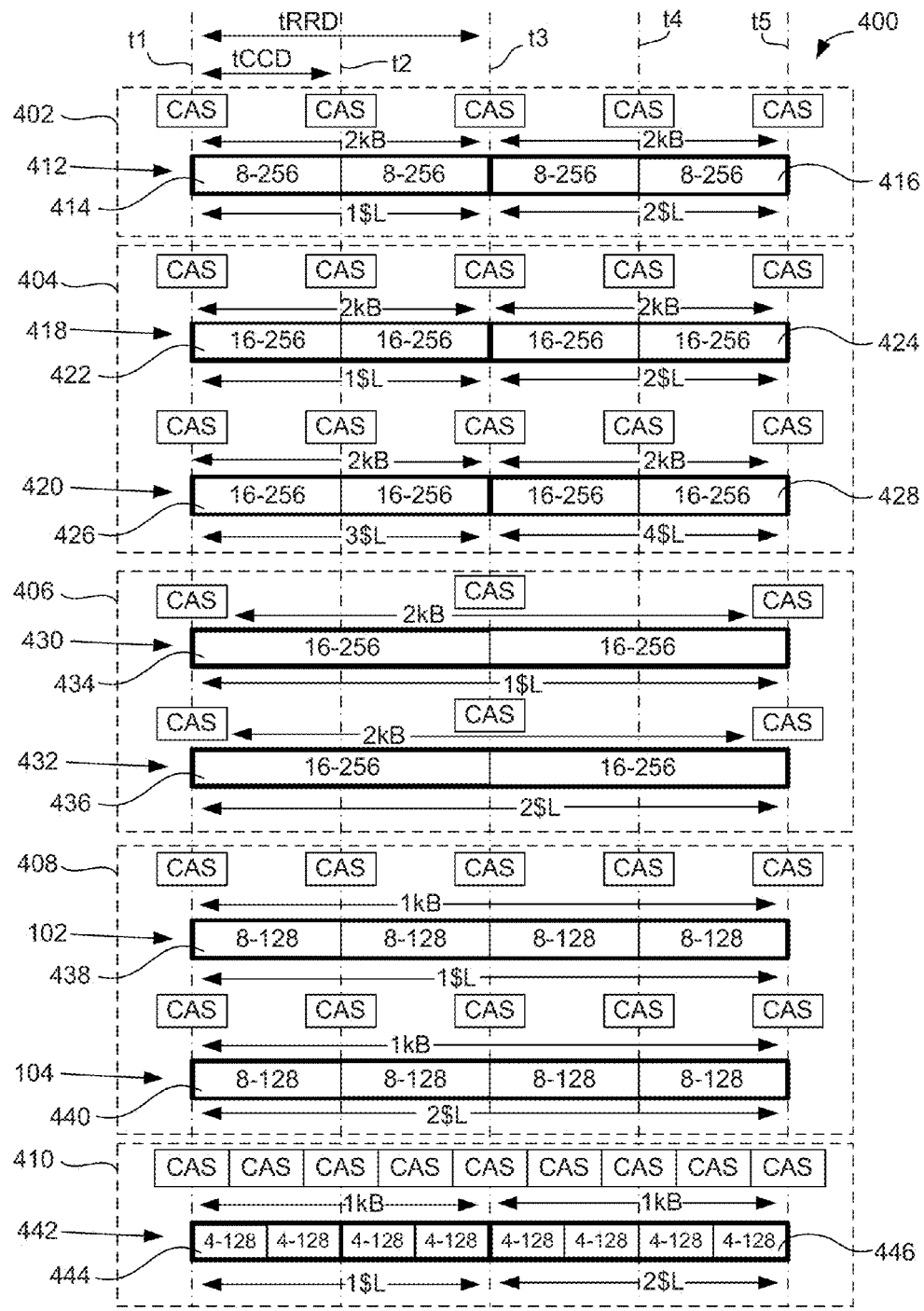
FIG. 4 illustrates a block diagram of memory stacks, according to various embodiments of the present disclosure.

FIG. 4 illustrates a timing diagram 400 for reading pages of memory according to various DRAM stacking configurations, according to embodiments of the disclosure. Timing diagram 400 includes a baseline configuration 402, a first configuration 404, a second configuration 406, a third configuration 408, and a fourth configuration 410.

Timing diagram 400 illustrate memory reads that may occur between a first time t1, a second time t2, a third time t3, a fourth time t4, and a fifth time t5. Column address strobe (CAS) to CAS delay tCCD represents a time constraint that may exist in a DRAM die between subsequent CAS commands. CAS commands received in a time frame closer than tCCD may result in tCCD violations. tCCD violations may result in too short of a bitline switch pulse to the DRAM array internally. This short pulse may not be able to switch the DRAM array related muxer gate capacitors or capacitances. Such violations may be resolved by partitioning the DRAM array more finely, e.g., into smaller access areas, which may result in lower area efficiency and higher costs. Activate to activate delay tRRD represents a time constraint that may exist in a DRAM die between subsequent page reads. In other words, a violation may occur if pages are switched in a time duration that is shorter than tRRD.

Each of the configurations 402, 404, 406, 408, and 410 may exhibit power and bandwidth characteristics as described in Table 1 and as described below.

TABLE 1

| Configuration | Peak BW of Stack | CAS Power of Stack | RAS Power of Stack |
| --- | --- | --- | --- |
| Baseline Config. | 1 | 1 | 1 |
| First Config. | 2 | 2 | 2 |
| Second Config. | 1 | 1 | 1 |
| Third Config. | 1 | 1.x | ½ |
| Fourth Config. | 1 | 1.x | ½ |

Baseline configuration 402 may provide a baseline for comparison of to other memory configurations described here. Baseline configuration 402 may include a single DRAM die 412. DRAM die 412 may include a 32-bit data bus, have a 2 kB (kiloByte) page size and be configured to read out 256 bits/CAS. Between the first time t1 and the fifth time t5, DRAM die 412 may be configured to access a 2 kB page 414 and a 2 kB page 416. Access of each page 414 and 416 may include two 8 bit bursts on the 32-bit data bus to read or write 256 bits. This burst pattern is represented as "8-256" twice within each of pages 414 and 416. Page 414 may represent a first cacheline access (1$L), and page 416 may represent a second cacheline access (2$L), according to various embodiments.

Referring to Table 1, the peak bandwidth (BW), CAS power, and RAS power of baseline configuration 402 may all be unity, e.g., 1, for the sake of comparison with other configurations.

First configuration 404 may include a first DRAM die 418 and a second DRAM die 420. DRAM dies 418 and 420 may each include a 16-bit data bus, have a 2 kB page size and be configured to read out 256 bits/CAS. Between the first time t1 and the fifth time t5, DRAM die 418 may be configured to access a 2 kB page 422 and a 2 kB page 424. Between the first time t1 and the fifth time t5, DRAM die 420 may be configured to access a 2 kB page 426 and a 2 kB page 428. Access of each of pages 422, 424, 426, and 428 may include two 16 bit bursts on each 16-bit data bus of DRAM die 418 and 420. This burst pattern is represented as "16-256". Page 422 may represent a first cacheline access 1$L, page 424 may represent a second cacheline access 2$L, page 426 may represent a third cacheline access 3$L, and page 428 may represent a fourth cacheline access 4$L, according to various embodiments.

Referring to Table 1, the peak bandwidth, CAS power, and RAS power of first configuration 404 may all be double, e.g., 2, the value of baseline configuration 402 because double the amount of data of the baseline configuration 402 is being access.

Second configuration 406 may include a first DRAM die 430 and a second DRAM die 432. DRAM dies 430 and 432 may each include a 16-bit data bus, have a 2 kB page size, and be configured to read out 256 bits/CAS. Between the first time t1 and the fifth time t5, DRAM die 430 may be configured to access a 2 kB page 434. Between the first time t1 and the fifth time t5, DRAM die 432 may be configured to access a 2 kB page 436. Second configuration 406 may receive CAS commands at twice the duration of the CAS to CAS minimum delay tCCD. Access of each of pages 434 and 436 may include two 16 bit bursts on each 16-bit data bus of DRAM die 430 and 432. This burst pattern is represented as "16-256". Page 434 may represent a first cacheline access 1$L, and page 436 may represent a second cacheline access 2$L.

Referring to Table 1, the peak bandwidth, CAS power, and RAS power of second configuration 406 may all be unity, e.g., 1, because data is strobed at a slower rate, so the benefit of stacking DRAM dies 430 and 436 may be nullified, as compared to baseline configuration 402.

Third configuration 408 may incorporate wordline configuration 200 to reduce RAS power consumption, as compared to baseline configuration 402. Third configuration 408 may include DRAM die 102 and DRAM die 104. DRAM dies 102 and 104 may each include a 16-bit data bus, have a 1 kB page size and be configured to read out 128 bits/CAS. The 1 kB page size may be determined, at least in part, by selectively partitioning one or more master wordlines, e.g., master wordline 204, with a sub-segment wordline address line. Between the first time t1 and the fifth time t5, DRAM die 102 may be configured to access a 1 kB page 438. Between the first time t1 and the fifth time t5, DRAM die 104 may be configured to access a 1 kB page 440. Access of each of pages 438 and 440 may include four 8 bit bursts on each 16-bit data bus of DRAM die 102 and 104. This burst pattern is represented as "8-128". Page 438 may represent a first cacheline access 1$L, and page 440 may represent a second cacheline access 2$L, according to various embodiments.

Referring to Table 1, for third configuration 408, the peak bandwidth may be the same as baseline configuration 402. Although each of DRAM dies 102 and 104 access half as many bits as DRAM die 412 between first time t1 and fifth time t5, cumulatively, DRAM dies 102 and 104 may access the same amount of data as DRAM die 412 for a given duration.

Third configuration 408 may have an increased CAS power figure because CAS commands may occur on each die. CAS power may not be double because more data is not being accessed. Even if CAS power is higher, such an increase in power consumption may be relatively small compared to RAS power savings.

Third configuration 408 may have a RAS power figure that may be approximately half of baseline configuration 402. During activation of page 438 or 440 (1 kB), a lower sub-wordline 216 or upper sub-wordline 218 is activated, but the same amount of data is fetched as is fetched from the baseline configuration 402. The power consumed while opening a page may scale linear with the size of the page. Half a page size with the same amount of data may result in half RAS power consumption and approximately the same CAS power consumption as baseline configuration 402. Since RAS power consumption in a DRAM die, e.g, DRAM die 102 and/or 104, may be much higher than CAS power, third configuration 408 may result in a net decrease is power consumption. RAS power consumption may be higher since for a 2 kB page 16 kbit sense amplifiers may be switched based on bit cell information. CAS makes 256 bits traveling from the sense amplifiers to the edge of the DRAM array, which may be less total power consumed. Thus, while accessing a similar quantity of data as DRAM die 412 of baseline configuration 402, third configuration 408 may be able to operate with approximately half the RAS power consumption as baseline configuration 402.

According to one embodiment third configuration 408 may use the common command address bus 156 configuration of DRAM stack 150. In a common bus scenario, command address bandwidth may be doubled to maintain peak bandwidth. To reduce the command address rates DRAM dies 102 and 104 may be configured with autoCAS sequences. Auto-CAS may help reduce the CAS power and bring the CAS power consumption down to a power consumption level that is similar to baseline configuration 402, rather than CAS of third configuration 408 being up to twice the power consumption of CAS of baseline configuration 402. According to embodiments, programmable cores of DRAM dies 102 and 104 may receive instructions to internally respond as though a CAS command had been received. The number of internal CAS commands issued may be selectively increased and/or decreased based on instructions received from a memory controller, i.e., via a mode register.

Fourth configuration 410 may include a single DRAM die 442. DRAM die 442 may include a 32-bit data bus, have a 1 kB page size and be configured to read out 128 bits/CAS. Between the first time t1 and the fifth time t5, DRAM die 442 may be configured to access a 1 kB page 444 and a 1 kB page 446. Access of each page 444 and 446 may include four 4 bit bursts on the 32-bit data bus to read or write a total of 512 bits. This burst pattern is represented as "4-128" four times within each of pages 444 and 446. Page 444 may represent a first cacheline access 1$L, and page 446 may represent a second cacheline access 2$L, according to various embodiments.

Referring to Table 1, the peak bandwidth, CAS power, and RAS power of fourth configuration 410 may similar to third configuration 408 without incorporating wordline configuration 200. However, as shown, twice as many CAS commands would be received to cause DRAM die 442 to provide the unity peak bandwidth of Table 1. The additional CAS commands may violate minimum delay times used by DRAM die 442 to function and may therefore render DRAM die 442 inoperable.

Figure 5:
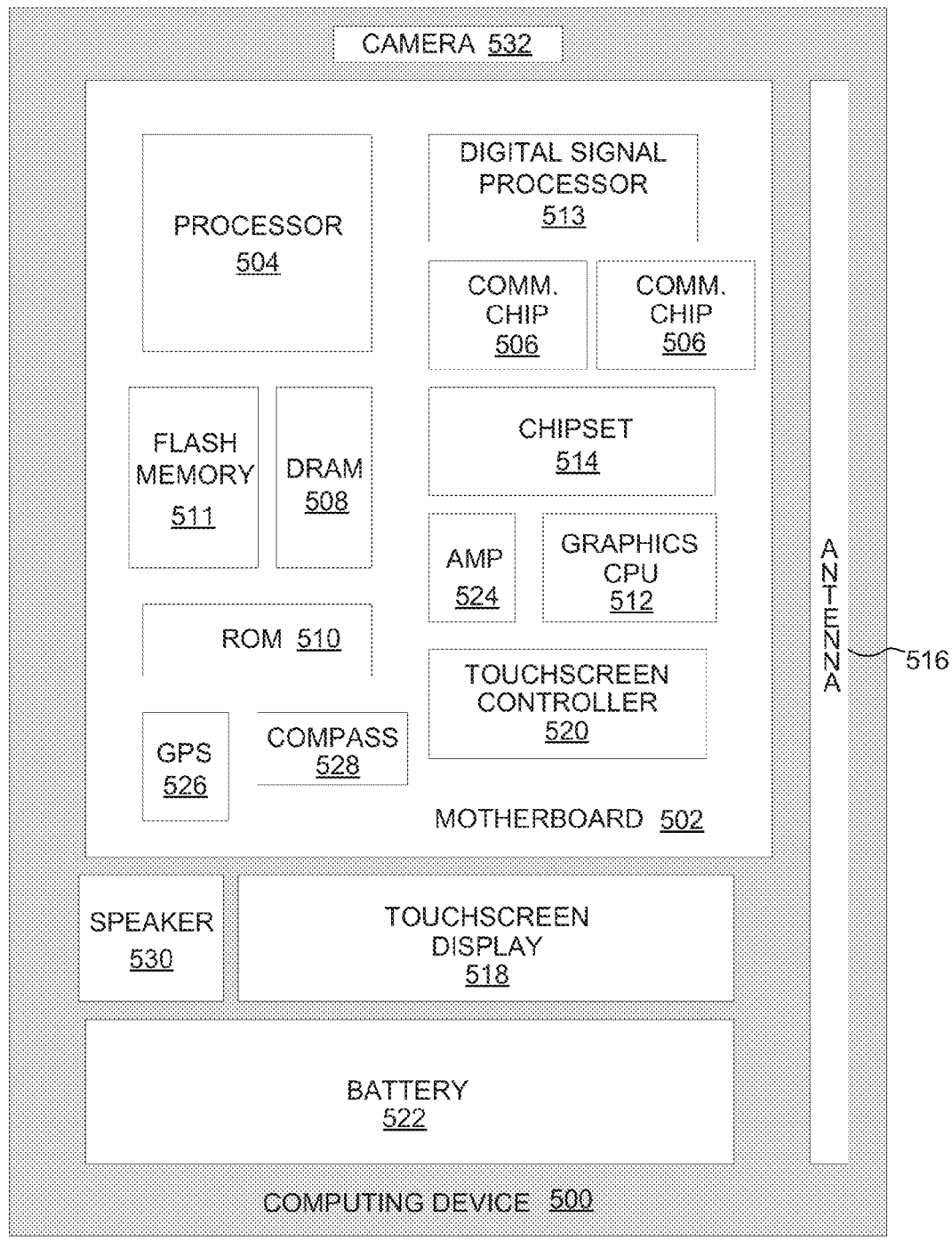
FIG. 5 describes a block diagram of an implementation of the memory stacks of FIG. 1A or FIG. 1B, according to various embodiments of the present disclosure.

FIG. 5 illustrates a computing device 500 in accordance with one implementation of an embodiment of the invention. The computing device 500 houses a board 502. The board 502 may include a number of components, including but not limited to a processor 504 and at least one communication chip 506. The processor 504 may be physically and electrically coupled to the board 502. In some implementations the at least one communication chip 506 may also be physically and electrically coupled to the board 502. In further implementations, the communication chip 506 may be part of the processor 504.

Depending on its applications, computing device 500 may include other components that may or may not be physically and electrically coupled to the board 502. These other components include, but are not limited to, volatile memory (e.g., DRAM 508), non-volatile memory (e.g., ROM 510), flash memory 511, a graphics processor 512, a digital signal processor 513, a crypto processor, a chipset 514, an antenna 516, a display, a touchscreen display 518, a touchscreen controller 520, a battery 522, an audio codec, a video codec, a power amplifier 524, a global positioning system (GPS) device 526, a compass 528, an accelerometer, a gyroscope, a speaker 530, a camera 532, and a mass storage device (such as hard disk drive, compact disk (CD), digital versatile disk (DVD), and so forth).

According to various embodiments, chipset 514 may include memory controller 102 and TCO compensation circuit 112 or 400. According to embodiments, DRAM 508 may be implemented with wordline configuration 200 and may include one or more DRAM stacks 100 and/or 150.

The communication chip 506 may enable wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

The processor 504 of the computing device 500 includes an integrated circuit die packaged within the processor 504. In some implementations of the disclosure, the integrated circuit die of the processor may include wordline configuration 200 as part of one or more DRAM stacks 100 and/or 150 operably configured as processor cache, according to embodiments of the disclosure. The term "processor" may refer to any device or portion of a device that processes electronic data from registers and/or memory to transform that electronic data into other electronic data that may be stored in registers and/or memory.

The communication chip 506 also includes an integrated circuit die packaged within the communication chip 506.

In further implementations, another component housed within the computing device 500 may contain an integrated circuit die that includes one or more devices, such as processor cores, cache and one or more memory controllers.

In various implementations, the computing device 500 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

According to various embodiments, an apparatus may include a number of segment wordline drivers configured to drive a number of segment wordlines. Each of the number of segment wordlines may be coupled to a sub-array of memory cells. The apparatus may include a master wordline coupled to number of segment wordline drivers. The master wordline may be responsive to row address strobe (RAS) signals received by the apparatus. The apparatus may include a segment wordline enable coupled to logic to selectively disable ones of the number of segment wordline drivers to partition a page of the apparatus to reduce power consumed by activation of the disabled ones of the number of segment wordlines. The apparatus may include a dynamic random access memory (DRAM) array of memory cells that may include the sub-array of memory cells. The segment wordline enable may be configured to partition the page into a lower sub-wordline and an upper sub-wordline. Each of the lower sub-wordline and the upper sub-wordline may include different physical halves of the page. The segment wordline enable may be configured to partition the page into a number of equally-sized partitions.

One of the equally-sized partitions at a time may be enabled while the other ones of the equally-sized partitions are disabled.

In embodiments, the segment wordline enable may be a first segment wordline enable, and the apparatus may further include a second segment wordline enable configured to selectively disable ones of the number of segment wordline drivers that are not disabled based on the first segment wordline enable. The second segment wordline enable may be configured to selectively disable at least half of the ones of the number of segment wordline drivers that are not disabled based on the first segment wordline enable. The segment wordline enable may selectively disable ones of the number of segment wordline drivers in response to receipt of a signal from a memory controller.

According to various embodiments, a dynamic random access memory (DRAM) stack may include a first DRAM die. The first DRAM die may include a first number of segment wordline drivers each coupled to a first set of sub-arrays of memory cells and each configured to be responsive to a first master wordline signal. The first DRAM die may include a first segment wordline enable configured to selectively disable at least half of the first number of segment wordline drivers during operation to reduce total wordline power consumption of by the first DRAM die. The DRAM stack may include a second DRAM die coupled to the first in a stacked configuration and configured to transfer data to and from a memory controller in response to control signals received from the memory controller.

According to embodiments, the number of segment wordline drivers may be a first number of segment wordline drivers. The set of sub-arrays may be a first set of sub-arrays, and the segment wordline enable may be a first segment wordline enable. The second DRAM die may include a second number of segment wordline drivers each coupled to a second sub-array of memory cells and each configured to be responsive to a second master wordline signal; and a segment wordline enable configured to selectively disable at least half of the number of segment wordline drivers during operation to reduce total wordline power consumption of by the first DRAM die. The second master wordline signal may be the same as the first master wordline signal. The first DRAM die may include through-silicon-vias (TSVs) configured to couple each terminal of the second DRAM die to a printed circuit board.

According to various embodiments, a method may include receiving a master wordline signal, with a dynamic random access memory (DRAM), to drive a number of segment wordline drivers. The method may include receiving a segment wordline enable signal, with the DRAM, to selectively disable at least half of the segment wordline drivers from responding to the master wordline signal to partition a page of the DRAM to reduce power consumption by segment wordlines coupled to the disabled ones of the segment wordline drivers. The method may include, in response to a change of the segment wordline enable signal, selectively enabling some of the previously selectively disabled at least half of the segment wordline drivers. The segment wordline enable signal may be a first segment wordline enable signal. The method may further include receiving a second segment wordline enable signal and disabling the number of segment wordline drivers based on a logic combination of the first segment wordline enable signal and the second wordline enable signal. The method may further include generating a column address strobe (CAS) signal within the DRAM and automatically activating bitlines within the DRAM based on the generated CAS signal. Generating may be based on a value of a mode register of the DRAM.

According to various embodiments, a system may include a printed circuit board (PCB); a network interface coupled to the printed circuit board to transfer data to and from a network; and a processor having a dynamic random access memory (DRAM) stack configured as processor cache. The DRAM stack may include a first DRAM die. The first DRAM die may include a first number of segment wordline drivers each coupled to a first set of sub-arrays of memory cells and each configured to be responsive to a first master wordline signal. The first DRAM may include a first segment wordline enable configured to selectively disable at least half of the first number of segment wordline drivers during operation to reduce total wordline power consumption of by the first DRAM die. The DRAM stack may include a second DRAM die coupled to the first in a stacked configuration and configured to transfer data to and from a memory controller in response to control signals received from the memory controller. The DRAM stack may be a first DRAM stack. The system may further include a DRAM module coupled to the PCB and configured as main memory. The DRAM module may include a second DRAM stack configured to selectively disable at least half of a page of DRAM dies included in the DRAM stack to reduce power consumption of the DRAM stack.

According to embodiments, the system may be a selected one of a laptop, a netbook, a notebook, an ultrabook, a smartphone, a tablet, a personal digital assistant, an ultra mobile PC, a mobile phone, a desktop computer, a server, a printer, a scanner, a monitor, a set-top box, an entertainment control unit, a digital camera, a portable music player, or a digital video reorder. The system may further include a display device operatively coupled with the processor. The display device may be a touch screen.

The above description of illustrated implementations of the disclosure, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Specific features of any of the above described embodiments may be fully or partially combined with one or more other embodiments, either wholly or partially, to form new embodiments of the disclosure.

What is claimed is:

1. An apparatus, comprising:
   a plurality of segment wordline drivers configured to drive a plurality of segment wordlines, wherein each of the plurality of segment wordlines is coupled to a sub-array of memory cells;
   a master wordline coupled to the plurality of segment wordline drivers, wherein the master wordline is responsive to row address strobe (RAS) signals received by the apparatus;
   a first segment wordline address line coupled to a plurality of logic that are respectively coupled to at least two of the plurality of segment wordline drivers, the first segment wordline address line to provide a first signal to the plurality of logic to use to selectively disable ones of the plurality of segment wordline drivers to partition a page of the apparatus to reduce power consumed by activation of the disabled ones of the plurality of segment wordlines; and a second segment wordline address line coupled to the plurality of logic, the second segment wordline address line to provide a second signal to the logic to use to selectively disable one of the plurality of logic, wherein disabling the one of the plurality of logic results in disabling the at least two of the plurality of segment wordline drivers that are coupled to the one of the plurality of logic.

2. The apparatus of claim 1, wherein the apparatus includes a dynamic random access memory (DRAM) that includes the first segment wordline address line and the second segment wordline address line.

3. The apparatus of claim 1, wherein the logic is to use the second signal to partition the page into a lower sub-wordline and an upper sub-wordline, wherein each of the lower sub-wordline and the upper sub-wordline include different physical halves of the page.

4. The apparatus of claim 1, wherein the logic is to use the second signal to partition the page into a number of equally-sized partitions, wherein one of the equally-sized partitions at a time is enabled while the other ones of the equally-sized partitions are disabled.

5. The apparatus of claim 1, wherein the logic is to use the second signal to selectively disable at least half of the ones of the plurality of segment wordline drivers that are not disabled based on the first signal.

6. The apparatus of claim 1, wherein the first segment wordline address line provides the first signal in response to receipt of a signal from a memory controller.

7. A method, comprising:
providing, from a first segment wordline address line, a first signal to a plurality of logic of a dynamic random access memory (DRAM), the first signal to cause the plurality of logic to selectively disable at least half of a plurality of segment wordline drivers from responding to a master wordline signal to partition a page of the DRAM to reduce power consumption by segment wordlines coupled to the disabled ones of the segment wordline drivers;

providing, from a second segment wordline address line, a second signal to the plurality of logic, the second signal to cause the plurality of logic to selectively disable ones of the plurality of logic, wherein disabling the ones of the plurality of logic results in disabling ones of the plurality of segment wordline drivers that are coupled to the plurality of logic; and in response to a change of the first signal, selectively enabling some of the previously selectively disabled at least half of the segment wordline drivers.

8. The method of claim 7, further comprising:
generating a column address strobe (CAS) signal within the DRAM; and
automatically activating bitlines within the DRAM based on the generated CAS signal.

9. The method of claim 8, wherein said generating is based on a value of a mode register of the DRAM.

* * * * *